(12) United States Patent
Yin et al.

(10) Patent No.: US 11,457,529 B2
(45) Date of Patent: Sep. 27, 2022

(54) CIRCUIT BOARD, APPARATUS AND METHOD FOR FORMING VIA HOLE STRUCTURE

(71) Applicant: ZTE CORPORATION, Guangdong (CN)

(72) Inventors: Changgang Yin, Guangdong (CN); Yingxin Wang, Guangdong (CN); Bi Yi, Guangdong (CN); Huazhang Cao, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 17/282,410

(22) PCT Filed: Sep. 27, 2019

(86) PCT No.: PCT/CN2019/108411
§ 371 (c)(1),
(2) Date: Apr. 2, 2021

(87) PCT Pub. No.: WO2020/073823
PCT Pub. Date: Apr. 16, 2020

(65) Prior Publication Data
US 2021/0392744 A1    Dec. 16, 2021

(30) Foreign Application Priority Data
Oct. 8, 2018  (CN) .......................... 201811169550.0

(51) Int. Cl.
*H05K 1/02*        (2006.01)
*H05K 1/11*        (2006.01)
(Continued)

(52) U.S. Cl.
CPC ......... *H05K 1/0251* (2013.01); *H05K 3/0094* (2013.01); *H05K 3/429* (2013.01);
(Continued)

(58) Field of Classification Search
CPC ... H05K 1/02; H05K 1/11; H05K 1/18; H05K 1/021; H05K 1/024; H05K 1/0251;
(Continued)

(56) References Cited

U.S. PATENT DOCUMENTS 4,188,415 A * 2/1980 Takahashi .............. H05K 3/445
428/137
4,923,520 A * 5/1990 Anzai .................... C09C 1/3081
106/490
(Continued)

FOREIGN PATENT DOCUMENTS

CN    102291929 A    12/2011
CN    105764235 A    7/2016
(Continued)

OTHER PUBLICATIONS

WIPO, International Search Report dated Nov. 21, 2019.
(Continued)

*Primary Examiner* — Xiaoliang Chen
(74) *Attorney, Agent, or Firm* — Li & Cai Intellectual Property (USA) Office

(57) ABSTRACT

Provided are a circuit board, an apparatus and a method for forming a via hole structure. A via hole structure formed on a main body (10) of a circuit board includes a hole (12) enclosed by a conductive layer in the main body (10), the conductive layer constitutes a wall (11) of the hole (12), and a dielectric filling layer (13), which has a dielectric constant smaller than that of the main body (10), is disposed between at least a portion of the wall (11) of the hole (12) and the main body (10), so that the parasitic capacitance of a via hole is decreased, and the impedance of the via hole is increased to become closer to the impedance of a transmission line, thereby effectively improving impedance continuity of a system link.

14 Claims, 5 Drawing Sheets

(51) Int. Cl.
  *H05K 1/18* (2006.01)
  *H05K 3/10* (2006.01)
  *H05K 3/36* (2006.01)
  *H05K 3/40* (2006.01)
  *H05K 3/42* (2006.01)
  *H05K 3/44* (2006.01)
  *H01L 21/768* (2006.01)
  *H01L 23/48* (2006.01)
  *H01L 23/66* (2006.01)
  *H05K 3/00* (2006.01)

(52) U.S. Cl.
  CPC ............... *H05K 2201/0212* (2013.01); *H05K 2201/095* (2013.01)

(58) Field of Classification Search
  CPC ........ H05K 1/111; H05K 1/115; H05K 1/116; H05K 3/0094; H05K 3/10; H05K 3/36; H05K 3/40; H05K 3/42; H05K 3/44; H05K 3/445; H05K 3/429; H05K 3/4641; H01L 21/768; H01L 23/48; H01L 23/66; H01L 23/481
  USPC ........ 361/762, 761, 763, 782; 174/255, 258, 174/260, 262, 264, 266
  See application file for complete search history.

(56) References Cited

U.S. PATENT DOCUMENTS

| | | | | |
|---|---|---|---|---|
| 5,847,327 | A * | 12/1998 | Fischer | H05K 3/445 |
| | | | | 174/262 |
| 5,949,030 | A * | 9/1999 | Fasano | H05K 1/115 |
| | | | | 174/265 |
| 6,204,453 | B1 * | 3/2001 | Fallon | H05K 3/44 |
| | | | | 174/255 |
| 6,541,712 | B1 * | 4/2003 | Gately | H05K 1/115 |
| | | | | 174/262 |
| 8,440,917 | B2 * | 5/2013 | Harvey | H05K 1/0233 |
| | | | | 174/262 |
| 9,596,768 | B2 * | 3/2017 | We | H01L 23/49827 |
| 9,706,656 | B2 | 7/2017 | Hsu et al. | |
| 10,249,943 | B2 * | 4/2019 | Brigham | H01Q 9/0421 |
| 2005/0096423 | A1 * | 5/2005 | Jennrich | B82Y 30/00 |
| | | | | 524/492 |
| 2006/0079606 | A1 * | 4/2006 | Min | C01B 33/124 |
| | | | | 423/335 |
| 2007/0169959 | A1 | 7/2007 | Ding et al. | |
| 2008/0144298 | A1 * | 6/2008 | Inagaki | H01L 25/162 |
| | | | | 361/763 |
| 2008/0158838 | A1 * | 7/2008 | Inagaki | H01G 2/06 |
| | | | | 257/E23.079 |
| 2008/0236881 | A1 * | 10/2008 | Tanaka | H05K 1/0219 |
| | | | | 174/266 |
| 2008/0245555 | A1 * | 10/2008 | Li | H05K 1/0222 |
| | | | | 174/262 |
| 2009/0321126 | A1 * | 12/2009 | Chandrasekraran | |
| | | | | H05K 1/0222 |
| | | | | 174/266 |
| 2010/0124035 | A1 * | 5/2010 | Bandholz | H05K 1/162 |
| | | | | 361/782 |
| 2010/0326716 | A1 * | 12/2010 | Zhang | H05K 1/024 |
| | | | | 174/262 |
| 2011/0163348 | A1 * | 7/2011 | Lin | H05K 1/021 |
| | | | | 257/E33.075 |
| 2011/0220396 | A1 * | 9/2011 | Abe | H05K 3/4641 |
| | | | | 977/932 |
| 2011/0232953 | A1 * | 9/2011 | Oga | H05K 3/4602 |
| | | | | 174/258 |
| 2011/0290408 | A1 * | 12/2011 | Samejima | H05K 3/0011 |
| | | | | 156/182 |
| 2012/0024586 | A1 * | 2/2012 | Yoshimura | H05K 1/036 |
| | | | | 29/852 |
| 2012/0102732 | A1 * | 5/2012 | Maeda | H01L 21/4857 |
| | | | | 29/847 |
| 2012/0234587 | A1 * | 9/2012 | Nakamura | H05K 3/429 |
| | | | | 29/830 |
| 2013/0240259 | A1 * | 9/2013 | Yoshimura | H05K 3/4608 |
| | | | | 174/266 |
| 2015/0008029 | A1 * | 1/2015 | Lee | H05K 3/429 |
| | | | | 174/266 |
| 2015/0181693 | A1 * | 6/2015 | Wu | H05K 1/0222 |
| | | | | 174/262 |
| 2016/0174360 | A1 | 6/2016 | Hsu et al. | |
| 2016/0225694 | A1 * | 8/2016 | Barth | H01L 23/481 |
| 2017/0040678 | A1 * | 2/2017 | Brigham | H05K 1/024 |

FOREIGN PATENT DOCUMENTS

| | | |
|---|---|---|
| JP | 2000261117 A | 9/2000 |
| JP | 2009064869 A | 3/2009 |
| WO | WO2018125679 A1 | 7/2018 |

OTHER PUBLICATIONS

China Patent Office, First Office Action dated Apr. 28, 2022, for corresponding Chinese application No. 201811169550.0.
Japan Patent Office, First Office Action dated Apr. 5, 2022, for correspondingJP application No. 2021-517629.
European Patent Office, Extended European Search Report dated May 20, 2022 for corresponding EP application No. 19871140.0.

* cited by examiner

CIRCUIT BOARD, APPARATUS AND METHOD FOR FORMING VIA HOLE STRUCTURE

CROSS REFERENCE TO RELATED APPLICATION

This is a National Phase Application filed under 35 U.S.C. 371 as a national stage of PCT/CN2019/108411, filed on Sep. 27, 2019, an application claiming the benefit of Chinese patent application No. 201811169550.0, filed on Oct. 8, 2018, the entire contents of which are incorporated herein by reference.

TECHNICAL FIELD

The embodiments of the present disclosure relate to, but are not limited to, the field of circuit boards, and particularly relate to, but are not limited to, a circuit board, an apparatus and a method for forming a via hole structure.

BACKGROUND

At present, as system capacity becomes larger and larger and signal rates become higher and higher, density in Printed Circuit Board (PCB) design is increased, and thicknesses and layers of PCBs are increased as well, resulting more and more requirements for signal integrity than before. A via hole is a structure inevitably used in high-speed and high-density design, and the performance of the via hole directly affects performance of a high-speed and high-density product. Impedance continuity is one of the important indexes for measuring performance of a via hole, and the impedance of a via hole is generally much smaller than characteristic impedance of a PCB transmission line connected to the via hole, which results in poor impedance continuity of a whole link and causes a signal integrity problem.

The impedance of a via hole is related to parasitic capacitance and parasitic inductance of the via hole. The greater the parasitic capacitance is, the smaller the impedance of the via hole is; and the greater the parasitic inductance is, the greater the impedance of the via hole is. In order to increase the impedance of the via hole, a method in existing art is to enlarge an anti-pad of the via hole through cutout to a certain extent. However, the size of the cutout cannot be unlimited in practical applications; otherwise, completeness of a reference plane of signals is affected, which may cause other signal integrity problems. Moreover, when the size of the cutout is increased to a certain extent, the effect of increasing the impedance of the via hole hits a bottleneck. Another method in the existing art is to decrease a diameter of the via hole. The smaller the diameter of the via hole is, the smaller the parasitic capacitance is, the greater the impedance of the via hole is, the better the impedance continuity of system link is.

However, with the increase of the system capacity, the PCBs become thicker and thicker. Since an aspect ratio (i.e., a ratio of thickness of a PCB to diameter of a via hole), which is one of the key indexes that affect the difficulty of PCB manufacturing, gets greater with the decrease of the diameter of the via hole, the manufacturing difficulty of design of small holes is larger, so that a yield rate of the PCBs is affected, which further affects cost and reliability of the products. The failure of the manufacturing of the PCBs caused by the large aspect ratio may even lead to the discarding of the PCBs. Therefore, how to effectively increase the impedance of a via hole is an urgent technical problem at present.

SUMMARY

The embodiments of the present disclosure provide a circuit board, an apparatus, and a method for forming a via hole structure, and mainly aim to at least solve the technical problem of how to improve the impedance of a via hole.

The embodiments of the present disclosure provide a circuit board, including a main body with a multi-layer structure and a via hole structure disposed therein. The via hole structure includes a hole enclosed by a conductive layer in the main body, and the conductive layer constitutes a wall of the hole; and the via hole structure further includes a dielectric filling layer, which is disposed between at least a portion of the wall and the main body, and has a dielectric constant smaller than that of the main body.

The embodiments of the present disclosure further provide an apparatus, including a main body and the above circuit board disposed thereon.

The embodiments of the present disclosure further provide a method for forming a via hole structure, including: forming a first hole in a main body of a circuit board with a multi-layer structure; filling the first hole with a dielectric having a dielectric constant smaller than that of the main body of the circuit board; forming a second hole, which penetrates the dielectric and has a diameter smaller than that of the first hole, in the region of the dielectric in the first hole, the dielectric having the second hole formed therein being a dielectric filling layer; and forming a conductive layer on a wall of the second hole to obtain a via hole structure, with a hole enclosed by the conductive layer which constitutes a wall of the hole.

The beneficial effects of the present disclosure are as follows.

According to the circuit board, the apparatus and the method for forming a via hole structure provided by the embodiments of the present disclosure, the via hole structure formed in the main body of the circuit board includes the hole enclosed by the conductive layer in the main body of the circuit board, the conductive layer constitutes the wall of the hole, and the dielectric filling layer, which has the dielectric constant smaller than that of the main body of the circuit board, is disposed between at least a portion of the wall of the hole and the main body of the circuit board, that is, a dielectric constant of the dielectric around the via hole can be made smaller than that of the main body of the circuit board in some implementations, so that the parasitic capacitance of the via hole is decreased, and the impedance of the via hole is increased to become closer to the impedance of a transmission line, thereby effectively improving the impedance continuity of system link.

Other features and corresponding beneficial effects of the present disclosure are described in the latter part of the specification, and it should be understood that at least part of the beneficial effects will become apparent from the description in the specification of the present disclosure.

DETAILED DESCRIPTION

Figure 1:
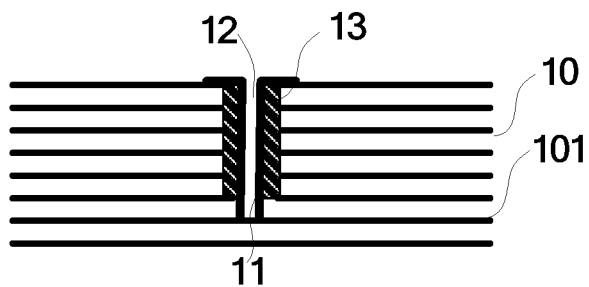
FIG. 1 is a first schematic structural diagram of a circuit board according to a first embodiment of the present disclosure.

In order to make the objectives, technical solutions and advantages of the present disclosure more apparent, the embodiments of the present disclosure are further described in detail below with reference to the specific implementations and the accompanying drawings. It should be understood that the specific embodiments described herein are merely intended to explain the present disclosure, and are not intended to limit the present disclosure.

First Embodiment

The embodiment aims to at least increase the impedance of a via hole in a circuit board to make the impedance of the via hole closer to the impedance of a transmission line on the circuit board, so as to improve impedance continuity of a system link. The embodiment provides a circuit board provided therein with a via hole structure, which includes a hole enclosed by a conductive layer in a main body of the circuit board, and the conductive layer constitutes a wall of the hole (the hole and the wall constitute a via hole). A dielectric filling layer, which has a dielectric constant smaller than that of the main body of the circuit board, is disposed between at least a portion of the wall of the hole and the main body of the circuit board, that is, the dielectric filling layer having the dielectric constant smaller than that of the main body of the circuit board is disposed between the via hole formed in the main body of the circuit board and the main body of the circuit board, so that a dielectric constant of a dielectric around the via hole is smaller than that of the main body of the circuit board, thereby decreasing the parasitic capacitance of the via hole. One way of calculating the parasitic capacitance of the via hole is shown as the following formula (1):

$$C = \frac{1.41\varepsilon_r T D_1}{D_2 - D_1} \quad (1)$$

In the above formula (1), C represents the parasitic capacitance of the via hole, T represents a thickness of the main body of the circuit board, $D_2$ represents a diameter of an anti-pad of the via hole, $D_1$ represents a diameter of a pad, and $\varepsilon_r$ represents a dielectric constant of a material of the main body of the circuit board. It can be seen from the formula (1) that the parasitic capacitance of the via hole is directly proportional to the dielectric constant of the material of the main body of the circuit board. Thus, in comparison with an existing structure that the dielectric around the via hole is made of the material of the main body of the circuit board, the embodiment arranges the dielectric filling layer, which has the dielectric constant smaller than that of the main body of the circuit board, between the via hole and the main body of the circuit board, so that the dielectric constant of the dielectric around the via hole can be decreased, that is, $\varepsilon_r$ is decreased, resulting in a decrease in the parasitic capacitance C of the via hole. With the parasitic capacitance of the via hole decreased, the impedance of the via hole is increased, thereby improving the impedance continuity of the system link.

FIG. 1 shows a structure of a circuit board according to one example of the embodiment. The circuit board includes a main body 10 with a multi-layer structure, and it is assumed that the uppermost layer in FIG. 1 is a top layer of the main body 10, and the lowest layer is a bottom layer of the main body 10; a via hole structure is formed in the main body 10, and includes a hole 12 enclosed by a conductive layer in the main body 10, and the conductive layer constitutes a wall 11 of the hole 12 (the hole 12 and the wall 11 constitute the via hole in the embodiment); and the via hole structure further includes a dielectric filling layer 13, which is disposed between at least a portion of the wall 11 and the main body 10, and has a dielectric constant smaller than that of the main body 10.

It should be understood that, in the embodiment, the dielectric filling layer 13 may be made of a dielectric of a single material or a dielectric of a plurality of materials, with the dielectric constant of the dielectric smaller than that of the main body 10. The dielectric constant and the material of the specific dielectric may be flexibly selected according to the system, for example, the dielectric includes, but is not limited to, resin. In the case where the dielectric is resin, the dielectric includes, but is not limited to, at least one of polyethylene, benzocyclobutene, and polytetrafluoroethylene (or teflon). The dielectric constant of the dielectric may be flexibly selected, as long as the dielectric constant of the dielectric is smaller than that of the main body 10 or can meet an existing requirement for the impedance of the via hole.

In the embodiment, the conductive layer which encloses the hole 12, that is, the wall 11 of the hole 12, is made of a conductive material. The specific process for forming the wall 11 may be flexibly selected, for example, the process for forming the wall 11 includes, but is not limited to, various metal plating processes (for example, the process includes, but is not limited to, electroplating).

It should be understood that, in the embodiment, the shape of a cross section of the hole 12 includes, but is not limited to, a circle, and may be flexibly set according to specific application requirements. For example, the cross section of the hole 12 is set to be an ellipse in some application scenarios, or other shapes which can meet the requirements of the application scenarios.

Figure 2:
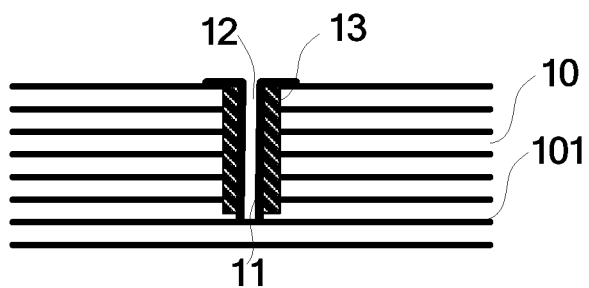
FIG. 2 is a second schematic structural diagram of a circuit board according to the first embodiment of the present disclosure.
Figure 3:
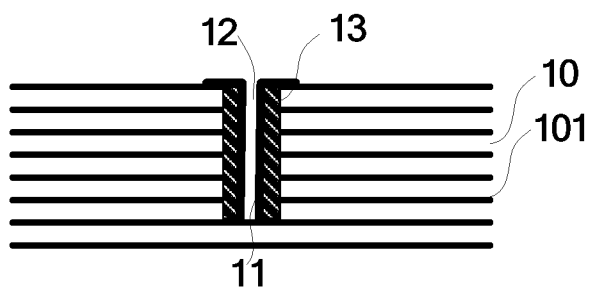
FIG. 3 is a third schematic structural diagram of a circuit board according to the first embodiment of the present disclosure.

In the embodiment, the dielectric filling layer 13 is disposed between at least a portion of the wall 11 and the main body 10. In some examples (for example, see FIG. 3), the dielectric filling layer 13 is disposed between the entire wall 12 and the main body 10. Or, the dielectric filling layer 13 is only disposed between a portion of the wall 11 and the main body 10, as shown in FIG. 1 and FIG. 2. The specific arrangement of the dielectric filling layer 13 may be flexibly selected according to requirements and specific implementation processes.

With reference to FIG. 1, in one example, the multi-layer structure of the main body 10 includes a target signal layer 101 corresponding to the via hole structure. A lower end of the hole 12 extends in the main body 10 along a thickness direction of the main body 10, and extends to the corresponding target signal layer 101 in the main body 10; a part of the wall 11 of the hole 12 is located inside the corresponding target signal layer 101, and at least a portion of such part of the wall 11 is in direct contact with the target signal layer 101, that is, no dielectric filling layer is disposed between at least a portion of the part of the wall 11 of the hole 12 inside the target signal layer 13 and the target signal layer 101, so as to realize electrical connection between the wall 11 and the target signal layer 101. In the example illustrated by FIG. 1, no dielectric filling layer 13 is disposed between the whole part of the wall 11 of the hole 12 inside the corresponding target signal layer 101 and the target signal layer 101, that is, the whole part of the wall 11 of the hole 12 inside the target signal layer 101 is in direct contact with the target signal layer 101, and the dielectric filling layer 13 is disposed between a part of the wall of the hole 12 beyond the target signal layer 101 and the main body 10.

In one example illustrated by FIG. 2, the dielectric filling layer 13 is disposed between an upper portion of a part of the wall 11 of the hole 12 inside the corresponding target signal layer 101 and the target signal layer 101, no dielectric filling layer 13 is disposed between a lower portion of the part of the wall 11 of the hole 12 inside the target signal layer 101 and the target signal layer 101, and the dielectric filling layer 13 is disposed between a part of the wall 11 of the hole 12 beyond the target signal layer 101 and the main body 10.

With regard to the arrangement ways of the dielectric filling layer 13 according to the examples illustrated by FIG. 1 and FIG. 2, when a hole is formed in the main body 10 for arranging the dielectric filling layer 13, since the hole is larger than a common via hole in diameter, the hole does not extend in the target signal layer 101, or only extends in a portion of the target signal layer 101 without penetrating through the target signal layer 101, for example, the hole extends in the target signal layer 101 and is located above a corresponding target line in the target signal layer 101, so as to avoid damaging a line or a pad in the target signal layer 101, thereby ensuring the reliability of the circuit board.

Figure 4:
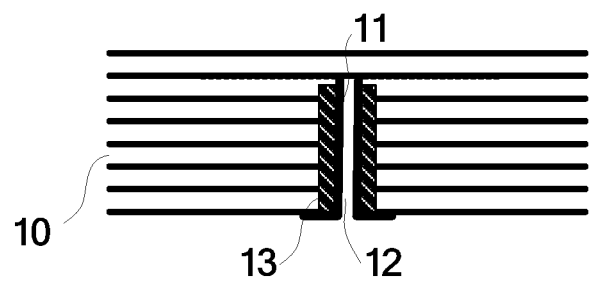
FIG. 4 is a fourth schematic structural diagram of a circuit board according to the first embodiment of the present disclosure.

In the embodiment, an upper end of the hole 12 is opposite to the lower end of the hole 12, and may reversely extend toward a top layer or a bottom layer of the main body 10 along the thickness direction of the main body 10. That is, the via hole in the embodiment may be formed along a direction from the top layer (i.e., a TOP layer) of the main body 10 to the corresponding target signal layer in the main body of the circuit board, and also may be formed along a direction from the bottom layer (i.e., a BOT layer) of the main body 10 to the corresponding target signal layer in the main body 10. For example, as shown in FIG. 4, the via hole is formed along a direction from the bottom layer (i.e., the BOT layer) of the main body 10 to the corresponding target signal layer in the main body 10, and the upper end of the hole 12 is located in the bottom layer of the main body 10.

It should be understood that, in the embodiment, the lower end of the hole refers to an end which extends into the main body 10 during the formation of the hole in the main body 10, and the upper end of the hole is an end opposite to the lower end. For example, in one example, when a hole is formed downwards (that is, towards an interior of the main body 10) from the top layer of the main body 10, a lower end of the formed hole is an end located inside the main body 10, and an upper end of the hole is an end located in the top layer of the main body 10. In another example, when a hole is formed upwards (that is, towards an interior of the main body 10) from the bottom layer of the main body 10, a lower end of the formed hole is an end located inside the main body 10, and an upper end of the hole is an end located in the bottom layer of the main body 10.

Figure 5:
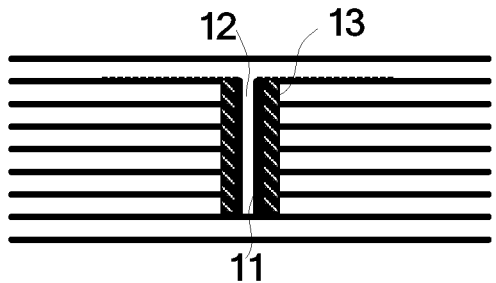
FIG. 5 is a fifth schematic structural diagram of a circuit board according to the first embodiment of the present disclosure.

In addition, it should be understood that, in some examples, the upper end and the lower end of the hole 12 may be located in two to-be-connected signal layers in the main body 10 for enabling connection between corresponding lines in the two signal layers. It is possible that both of the two signal layers are located inside the main body 10, or one layer is located inside the main body 10 and the other layer is the top layer or the bottom layer of the main body 10. For example, as shown in FIG. 5, the via hole structure provided by the embodiment may be formed inside the main body 10 in the case where both of the two signal layers are located inside the main body 10, and the via hole structure shown in FIG. 5 may be called a buried via hole.

It should be understood that, in the embodiment, the number of the via hole structure required to be arranged in the main body 10, distances between the via holes, and sizes of the via holes may be flexibly set according to specific system requirements. For example, one via hole structure may be arranged, or two or more via hole structures may be arranged according to specific requirements. For example, two via hole structures may be arranged for an application scenario of a differential device, or three or more via hole structures may be arranged for meeting the requirements of a corresponding application scenario. In the embodiment, when at least two via hole structures are arranged in the main body 10, a part of the via hole structures may adopt the via hole structure provided by the embodiment, and the rest of the via hole structures may adopt other via hole structures. It should be understood that an anti-pad structure of each via hole in the embodiment may adopt various anti-pad structures, and is not limited by the embodiment. Therefore, the above via hole structure formed in the main body 10 in the embodiment can be applied to a single-ended signal via hole, and also can be applied to a differential signal via hole. The application scenarios of the via hole include, but are not limited to, a Ball Grid Array (BGA) via hole, a via hole of crimp connector, a fan-out via hole of AC coupling capacitor, a fan-out via hole of rectangular chip pad, a fan-out via hole of solder connector pad, etc.

In addition, it should be understood that the via hole structure provided by the embodiment is not only applied to a through hole, and is also applied to the holes which include, but are not limited to, a laser blind hole, a mechanical blind hole, a buried hole, a Plating Over Filled Via (POFV), etc.

The embodiment further provides an apparatus which may be any apparatus that needs a circuit board having a via hole structure, and the apparatus includes an apparatus-main-body and the circuit board illustrated by the above examples, the circuit board being located on the apparatus-main-body.

In the via hole structure provided by the embodiment, the dielectric having the dielectric constant smaller than that of the main body of the circuit board may be filled between the via hole and the main body of the circuit board to decrease the dielectric constant of the dielectric around the via hole, so that the parasitic capacitance of the via hole is decreased, and the impedance of the via hole is increased to become closer to the impedance of the transmission line, thereby effectively improving the impedance continuity of the system link. It should be understood that, optionally, the via hole structure provided by the embodiment may be used in conjunction with other structures capable of increasing impedance of via hole and being combined with the via hole structure, so as to enhance the effect of increasing the impedance of the via hole. For example, the other structures include, but are not limited to, a structure formed by enlarging an anti-pad of the via hole through cutout to a certain extent, and a structure formed by decreasing the diameter of the via hole to a certain extent.

Second Embodiment

Figure 6:
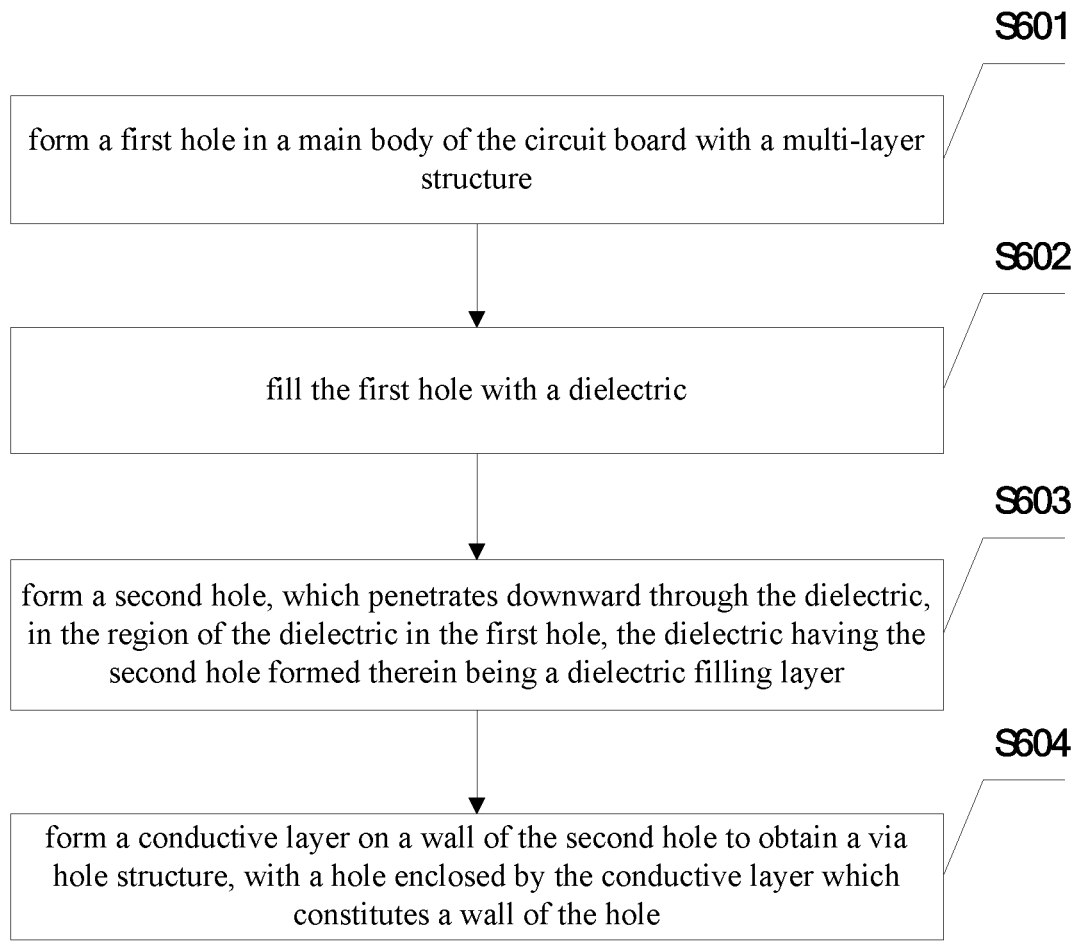
FIG. 6 is a flowchart illustrating a method for forming a via hole structure according to a second embodiment of the present disclosure.

For the convenience of understanding, an exemplary description of the embodiment is given below in conjunction with a method for forming a via hole structure. With the method for forming the via hole structure provided by the embodiment, the formed via hole includes, but is not limited to, the via hole structure described in one of the examples of the above embodiment. An exemplary process of a method for forming a via hole structure is shown in FIG. 6, and includes the following steps S601 to S604. At step S601, a first hole is formed in a main body of a circuit board with a multi-layer structure.

The objective of forming the first hole in the main body of the circuit board in this step is to arrange a dielectric having a dielectric constant smaller than that of the main body of the circuit board, so as to form a dielectric filling layer. The specific depth and diameter of the first hole may be flexibly set, and the first hole may be formed by adopting various methods, which include, but are not limited to, drilling, for example.

At step S602, the first hole is filled with a dielectric.

In this step, the method of filling the first hole with the dielectric may also be flexibly set according to specific application scenarios. For example, the method includes, but is not limited to, injection molding, depositing, or mold pressing.

In addition, it should be understood that, if a process allows integral formation of a dielectric filling layer and all layers of the main body of the circuit board, such integral formation process may be adopted to form a dielectric filling layer in a corresponding region of a corresponding layer of the main body of the circuit board. In the embodiment, the dielectric filling layer may be made of a dielectric of a single material or a dielectric of a plurality of materials, with a dielectric constant of the dielectric smaller than that of the main body of the circuit board. For example, a dielectric having a dielectric constant smaller than or equal to any one of 2.6, 2.5 or 2.4 is used. As another example, the dielectric includes, but is not limited to, resin.

At step S603, a second hole, which penetrates the dielectric, is formed in the region of the dielectric in the first hole, the dielectric having the second hole formed therein being a dielectric filling layer.

In the embodiment, the second hole and the first hole may be concentric holes, or may not. Moreover, a depth of the second hole is greater than or equal to that of the first hole, and a diameter of the second hole is smaller than that of the first hole.

At step S604, a conductive layer is formed on a wall of the second hole to obtain a via hole structure, with a hole enclosed by the conductive layer which constitutes a wall of the hole.

In this step, the conductive layer and the hole (the conductive layer constitutes the wall of the hole) enclosed by the conductive layer constitute the via hole in the embodiment, and the formation process of the conductive layer may be flexibly selected. The corresponding lines in each signal layer, which need to be connected through the via hole, can be connected through the conductive layer.

In the via hole structure obtained by the method for forming the via hole structure shown in FIG. 6, the dielectric filling layer having the dielectric constant smaller than that of the main body of the circuit board is formed between the via hole and the main body of the circuit board to decrease the dielectric constant of the dielectric around the via hole, so that the parasitic capacitance of the via hole is decreased, and the impedance of the via hole is increased to become closer to the impedance of the transmission line, thereby effectively improving the impedance continuity of the system link. The method for forming the via hole structure provided by the embodiment further has the following advantages at least:

the method provided by the embodiment is more beneficial to the design and fabrication of circuit boards (which include, but are not limited to, PCBs, for example): the method in the existing art is to decrease a diameter of a via hole to increase the impedance of the via hole, but such method causes the problem that it is hard to ensure cost and a yield rate because the fabrication difficulty becomes larger with an increase in an aspect ratio of a PCB; compared with such method in the existing art, the method provided by the embodiment increases the impedance of the via hole by decreasing the dielectric constant of the dielectric around the via hole, with no need to decrease the diameter of the via hole for increasing the impedance of the via hole, and thus decreases the fabrication difficulty greatly, lowers the fabrication cost, and increases the yield rate; and the method provided by the embodiment is beneficial to the improvement to impedance continuity: the dielectric constant of the dielectric around the via hole is decreased to decrease the parasitic capacitance of the via hole, so that the impedance of the via hole is increased to become closer to the impedance of the transmission line, thereby effectively improving the impedance continuity of the system link.

As stated above, in the embodiment, the depth of the second hole may be greater than or equal to that of the first hole. In one example, a lower end of the first hole extends in the main body of the circuit board along a thickness direction of the main body of the circuit board, and extends to a layer right on a corresponding target signal layer (or any other layer above the target signal layer, and to which layer the lower end extends may be flexibly set according to specific requirements) in the main body of the circuit board, or extends into the target signal layer and is located above a corresponding target line.

A lower end of the second hole extends in the main body of the circuit board, and extends to the target signal layer.

For the convenience of understanding, an exemplary description of the embodiment is given below in conjunction with a complete fabrication process.

Figure 7:
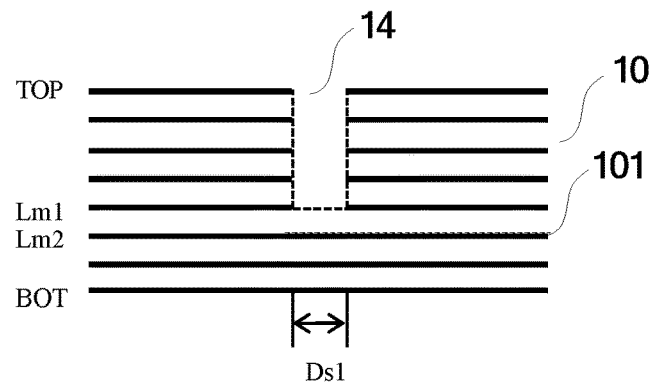
FIG. 7 is a schematic diagram of a section structure in a first drilling process according to the second embodiment of the present disclosure.
Figure 8:
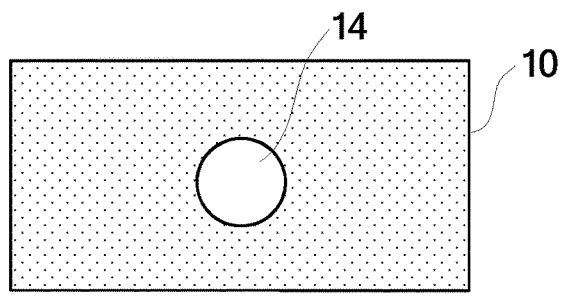
FIG. 8 is a top view in the first drilling process according to the second embodiment of the present disclosure.

With reference to FIG. 7 and FIG. 8, it is assumed that a main body 10 of a circuit board includes n layers, a first hole or a second hole is formed by drilling, and a target signal layer 101 is in Lm2 layer. In this example, a first hole 14 is formed by a first drilling process performed from a TOP layer to an m1-th (1<m1<n) layer (that is, Lm1 layer) of the main body 10, and a diameter of the first hole 14 is Ds1.

Figure 9:
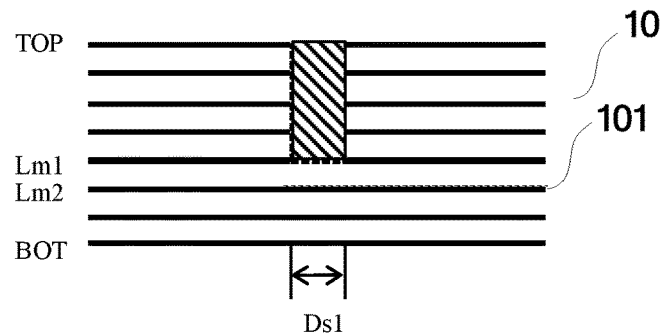
FIG. 9 is a schematic diagram of a section structure after a dielectric is filled according to the second embodiment of the present disclosure.
Figure 10:
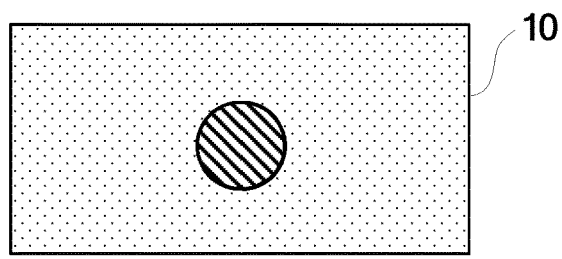
FIG. 10 is a top view after a dielectric is filled according to the second embodiment of the present disclosure.

With reference to FIG. 9 and FIG. 10, a dielectric is disposed in the first hole, for example, a dielectric having a low dielectric constant is used to fill the first hole 14, and the low dielectric constant refers to a dielectric constant smaller than that of the main body 10. For example, in the case where the main body 10 is made of glass fiber, the dielectric filling layer is made of a material having a dielectric constant smaller than that of the glass fiber, and the material includes, but is not limited to, resin, for example.

Figure 11:
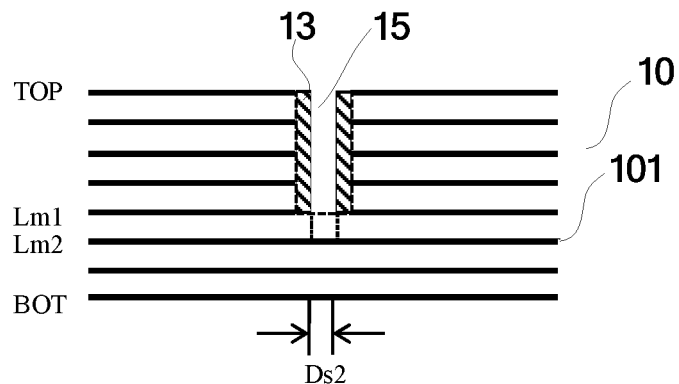
FIG. 11 is a schematic diagram of a section structure in a second drilling process according to the second embodiment of the present disclosure.
Figure 12:
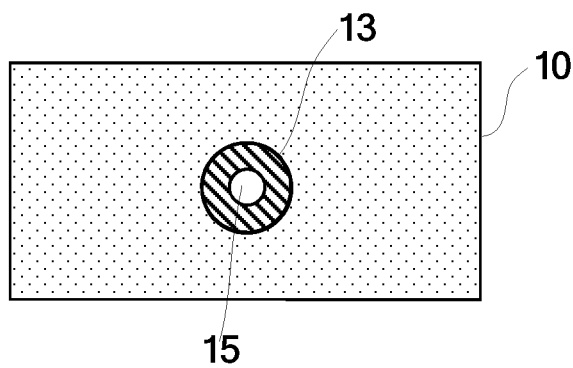
FIG. 12 is a top view in the second drilling process according to the second embodiment of the present disclosure.

With reference to FIG. 11 and FIG. 12, a second drilling process is performed inside the first hole from the TOP layer to an m2-th (m1<m2<n) layer of the main body 10 to obtain a second hole 15, which has a diameter Ds2 smaller than Ds1. After the dielectric filled in the first hole is removed from the second hole 15 during the drilling process, the remaining dielectric forms a dielectric filling layer 13.

Figure 13:
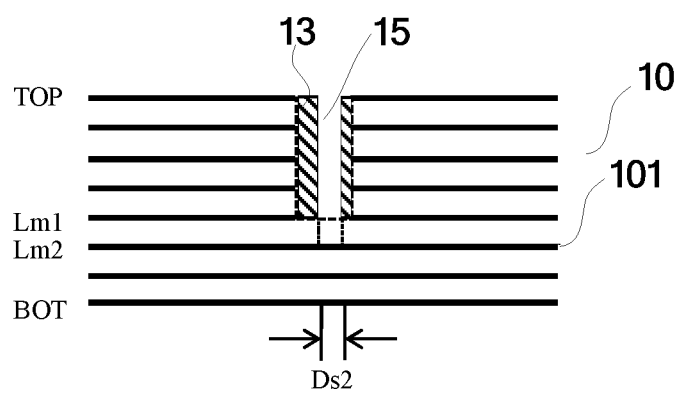
FIG. 13 is a schematic diagram of a section structure in another second drilling process according to the second embodiment of the present disclosure.
Figure 14:
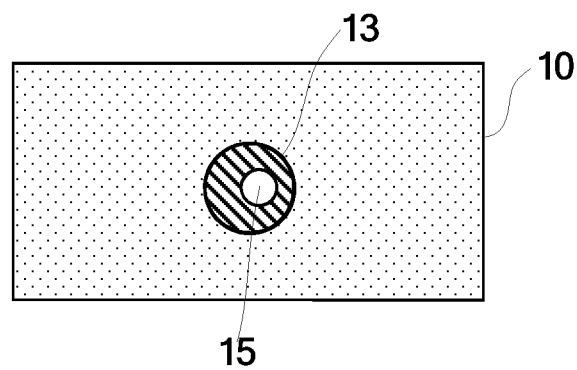
FIG. 14 is a top view in another second drilling process according to the second embodiment of the present disclosure.

In the example, the second drilling process is performed inside the first hole, and is not limited to starting from the center of the first hole to obtain the second hole 15 which has the same center as the first hole, and the second drilling process may start from any position. For example, with reference to FIG. 13 and FIG. 14, the second hole 15 may be located at any eccentric position in the first hole 14 relative to the first hole 14.

Figure 15:
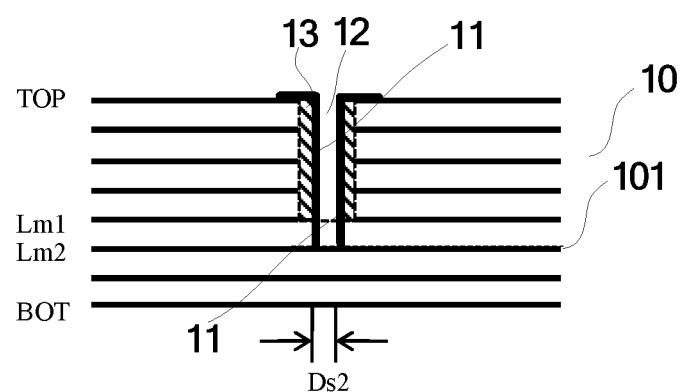
FIG. 15 is a schematic diagram of a section structure after a conductive layer is formed according to the second embodiment of the present disclosure.
Figure 16:
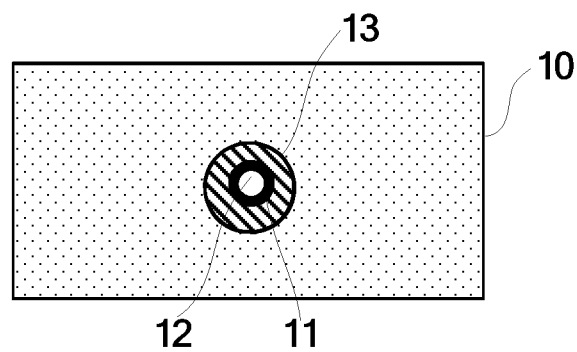
FIG. 16 is a top view after a conductive layer is formed according to the second embodiment of the present disclosure.

With reference to FIG. 15 and FIG. 16, a conductive layer 11 is formed in the second hole 15 by electroplating or other processes, with a hole 12 enclosed by the conductive layer 11.

For the convenience of understanding, an exemplary description of a formation process of the via hole structure is given below in the embodiment with reference to several specific application scenarios.

Scenario One: Differential Press-Fit Hole of High-Speed Board-To-Board Connector High-speed connectors are used in many apparatuses. In some application examples, it is generally ensured in the designs in the existing art that the impedance of a press-fit hole is in a range of 80 Ω to 85 Ω, which is discontinuous for a 100 Ω system, and thus discontinuity of a link is increased. Especially in application scenarios such as a 400G application scenario where the signal rate is higher and the signal edge is steeper, the requirement for the impedance of the via hole is higher. For some exemplary models of connectors, a drilling diameter of a differential via hole is 0.4 mm, and a diameter of an anti-pad is 1.2 mm; it is assumed that, in this application scenario, a PCB has 24 layers, adopts an M6G board, and has a dielectric constant of 3.5, and a target signal layer is in L10 layer. A formation process of a via hole structure in this application scenario includes that:

the dielectrics of a TOP layer to L9 layer are pressed in the sequence of pp (pre-pregnant)/core (inner core board)/pp to form a first sub-board (i.e., a part of a main body of a circuit board), and a first drilling process is performed on the first sub-board, with a drilling diameter Ds1 being 1.0 mm, the number of the drill holes being 2 and a center-to-center spacing between the drill holes being 1.2 mm (because the high-speed connector adopts differential signals);

after the drilling process of the first sub-board is completed, the holes are filled with a dielectric having a low dielectric constant (such as a dielectric having a dielectric constant of 2.6) to obtain dielectric filling layers;

the dielectrics of a BOTTOM layer to L12 layer are pressed in the sequence of pp/core/pp to form a second sub-board, and a drilling process is performed on the second sub-board, with the drilling diameter Ds1 being 1.0 mm, the number of the drill holes being 2 and the center-to-center spacing between the drill holes being 1.2 mm;

after the drilling process of the second sub-board is completed, the holes are filled with a dielectric having a low dielectric constant (such as a dielectric having a dielectric constant of 2.6) to obtain dielectric filling layers;

the first sub-board, core boards of L10 layer and L11 layer and the second sub-board are pressed together, and then a second drilling process is performed in the regions of the dielectric filling layers of the obtained drill holes from the centers of the drill holes, with a drilling diameter Ds2 being 0.4 mm; and the holes obtained by the second drilling process are subjected to electroplating to obtain corresponding via holes.

In this application scenario, with the above formation process, a dielectric constant of the dielectric around the differential via hole of the high-speed connector is decreased from 3.5 to 2.6, so that the parasitic capacitance of the differential via hole is effectively decreased, thereby increasing the impedance of the differential via hole, and improving the impedance continuity of the system link.

Scenario Two: BGA Differential Fan-Out Via Hole of High-Speed Board

High-speed chips may be packaged by means of BGA, and the impedance continuity of a BGA fan-out via hole is an important factor which influences the impedance continuity of a system link.

In this application scenario, a thickness of a main body of a circuit board is 3 mm, a drilling diameter of a BGA differential via hole is 0.2 mm, a dielectric of the main body of the circuit board is M6G, and has a dielectric constant of 3.5, and a target signal layer is in L10 layer. A formation process of a via hole structure in this application scenario includes that:

the dielectrics of a TOP layer to L9 layer are pressed in the sequence of pp (pre-pregnant)/core (inner core board)/pp to form a first sub-board, and a first drilling process is performed on the first sub-board, with a drilling diameter Ds1 being 0.7 mm, the number of the drill holes being 2 and a center-to-center spacing between the drill holes being 1 mm (because the high-speed chip adopts differential signals);

after the drilling process of the first sub-board is completed, the holes are filled with a dielectric having a low dielectric constant (such as a dielectric having a dielectric constant of 2.4) to obtain dielectric filling layers;

the dielectrics of a BOTTOM layer to L12 layer are pressed in the sequence of pp/core/pp to form a second sub-board, a drilling process is performed on the second sub-board, with the drilling diameter Ds1 being 0.7 mm, the number of the drill holes being 2 and the center-to-center spacing between the drill holes being 1 mm;

after the drilling process of the second sub-board is completed, the holes are filled with a dielectric having a low dielectric constant (such as a dielectric having a dielectric constant of 2.4) to obtain dielectric filling layers;

the first sub-board, core boards of L10 layer and L11 layer and the second sub-board are pressed together, and then a second drilling process is performed in the regions of the dielectric filling layers of the obtained drill holes from the centers of the drill holes, with a drilling diameter Ds2 being 0.2 mm; and the holes obtained by the second drilling process are subjected to electroplating to obtain corresponding via holes.

In this application scenario, with the above formation process, a dielectric constant of the dielectric around the BGA differential via hole is decreased from 3.5 to 2.4, so that the parasitic capacitance of the differential via hole is effectively decreased, thereby increasing the impedance of the differential via hole, and improving the impedance continuity of the system link.

Scenario Three: Laser Blind Hole of High-Density Board

Laser blind holes may be adopted in order not to occupy internal wiring space of a high-density board, and drilling performance of the laser blind holes can be effectively improved by using the via hole structure provided by the embodiment. For example, it is assumed that a thickness of a main body of a circuit board is 3 mm, a drilling diameter of a BGA differential via hole is 0.25 mm, a dielectric of the main body of the circuit board is M4S, and has a dielectric constant of 3.6, and signals are to be transmitted from a TOP layer to L3 layer. A formation process of a via hole structure in this application scenario includes that:

the dielectrics of the TOP layer to the L3 layer are pressed in the sequence of pp/core to form a first sub-board, then a mechanical drilling process (i.e., a first drilling process) is performed, and L2 layer is drilled through but the L3 layer is not;

after the drilling process of the first sub-board is completed, the hole is filled with a dielectric having a low dielectric constant (such as a dielectric having a dielectric constant of 2.0) to obtain a dielectric filling layer;

the dielectrics of L4 layer to a BOTTOM layer are pressed in the sequence of pp/core/pp to form a second sub-board;

the first sub-board and the second sub-board are pressed for the second time; and a laser drilling process (i.e., a second drilling process) is performed in the region of the dielectric filling layer from the TOP layer downward to the L3 layer, and then the hole obtained by the laser drilling process is subjected to electroplating to form a conductive layer used as a wall of the hole.

In this application scenario, with the above formation process, a dielectric constant of the dielectric around the laser blind hole of the high-density board is decreased from 3.6 to 2.0, so that the parasitic capacitance of the via hole is effectively decreased, thereby increasing the impedance of the via hole, and improving the impedance continuity of the link.

It should be understood that the via hole structure provided by the embodiment is not limited to being applied to the above several exemplary application scenarios. The via hole structure can be flexibly used in conjunction with other structures capable of increasing impedance of via hole and being combined with the via hole structure. For example, the other structures include, but are not limited to, a structure formed by enlarging the anti-pad of the via hole through cutout to a certain extent, and a structure formed by decreasing the diameter of the via hole to a certain extent. In this way, the impedance of the via hole can be further increased to become closer to the impedance of the transmission line, thereby effectively improving the impedance continuity of the system link.

It should be understood by those of ordinary skill in the art that the functional modules/units in all or some of the steps, the systems, and the devices in the methods disclosed above may be implemented as software (which may be implemented as computer program codes executable by a computing device), firmware, hardware, or suitable combinations thereof. If implemented as hardware, the division between the functional modules/units stated above is not necessarily corresponding to the division of physical components; for example, one physical component may have a plurality of functions, or one function or step may be performed through cooperation of several physical components. Some or all of the physical components may be implemented as software executed by a processor, such as a central processing unit, a digital signal processor or a microprocessor, or be implemented as hardware, or be implemented as an integrated circuit, such as an application specific integrated circuit.

In addition, it is well known by those of ordinary skill in the art that communication media generally include computer-readable instructions, data structures, program modules or other data in a modulated data signal, such as a carrier wave or other transmission mechanism, and may include any information delivery media. Therefore, the present disclosure is not limited to any specific combination of hardware and software.

The above is a further detailed description of the embodiments of the present disclosure in conjunction with the specific implementations, but the specific implementations of the present disclosure are not limited to the above description. Several simple deductions or substitutions can be made by those of ordinary skill in the art without departing from the concept of the present disclosure, and should be considered to fall within the scope of the present disclosure.

What is claimed is:

1. A circuit board, comprising a main body (10) with a multi-layer structure, and a via hole structure disposed in the main body (10), wherein the via hole structure comprises a hole (12) enclosed by a conductive layer in the main body (10), and the conductive layer constitutes a wall (11) of the hole (12); and the via hole structure further comprises a dielectric filling layer (13), which is disposed between at least a portion of the wall (11) and the main body (10), and has a dielectric constant smaller than a dielectric constant of the main body (10), wherein the multi-layer structure of the main body (10) comprises a target signal layer (101) corresponding to the via hole structure, and an end of the hole (12) located inside the main body (10) is a lower end, which extends in the main body (10) along a thickness direction of the main body (10), and extends to the corresponding target signal layer (101) in the main body (10); and a part of the wall (11) of the hole (12) is located inside the corresponding target signal layer (101), and at least a portion of the part of the wall (11) is in direct contact with the target signal layer (101).

2. The circuit board of claim 1, wherein the dielectric filling layer (13) is disposed between a part of the wall (11) of the hole (12) located beyond the corresponding target signal layer (101) and the main body (10).

3. The circuit board of claim 1, wherein a whole part of the wall (11) of the hole (12) located inside the corresponding target signal layer (101) is in direct contact with the corresponding target signal layer (101).

4. The circuit board of claim 1, wherein an upper end of the hole (12) extends toward a top layer or a bottom layer of the main body along the thickness direction of the circuit board.

5. The circuit board of claim 1, wherein at least two via hole structures are disposed in the main body (10).

6. The circuit board of claim 1, wherein the dielectric filling layer (13) is made of resin.

7. The circuit board of claim 2, wherein a whole part of the wall (11) of the hole (12) located inside the corresponding target signal layer (101) is in direct contact with the corresponding target signal layer (101).

8. The circuit board of claim 2, wherein an upper end of the hole (12) extends toward a top layer or a bottom layer of the main body along the thickness direction of the circuit board.

9. The circuit board of claim 2, wherein at least two via hole structures are disposed in the main body (10).

10. The circuit board of claim 2, wherein the dielectric filling layer (13) is made of resin.

11. An apparatus, comprising an apparatus-main-body and a circuit board, the circuit board being disposed on the apparatus-main-body, wherein
the circuit board comprises a main body (10) with a multi-layer structure, and a via hole structure disposed in the main body (10), wherein the via hole structure comprises a hole (12) enclosed by a conductive layer in the main body (10), and the conductive layer constitutes a wall (11) of the hole (12); and the via hole structure further comprises a dielectric filling layer (13), which is disposed between at least a portion of the wall (11) and the main body (10), and has a dielectric constant smaller than a dielectric constant of the main body (10),
wherein the multi-layer structure of the main body (10) comprises a target signal layer (101) corresponding to the via hole structure, and an end of the hole (12) located inside the main body (10) is a lower end, which extends in the main body (10) along a thickness direction of the main body (10), and extends to the corresponding target signal layer (101) in the main body (10); and a part of the wall (11) of the hole (12) is located inside the corresponding target signal layer (101), and at least a portion of the part of the wall (11) is in direct contact with the target signal layer (101).

12. The apparatus of claim 11, wherein the dielectric filling layer (13) is disposed between a part of the wall (11) of the hole (12) located beyond the corresponding target signal layer (101) and the main body (10).

13. A method for forming a via hole structure, comprising:
forming a first hole in a main body (10) of a circuit board with a multi-layer structure;
filling the first hole with a dielectric having a dielectric constant smaller than a dielectric constant of the main body (10);
forming a second hole, which penetrates the dielectric and has a diameter smaller than a diameter of the first hole, in a region of the dielectric in the first hole, the dielectric having the second hole formed therein being a dielectric filling layer (13); and
forming a conductive layer on a wall of the second hole to obtain a via hole structure, wherein a hole (12) is enclosed by the conductive layer, and the conductive layer constitutes a wall (11) of the hole (12),
wherein the multi-layer structure of the main body (10) comprises a target signal layer (101) corresponding to the via hole structure, and an end of the hole (12) located inside the main body (10) is a lower end, which extends in the main body (10) along a thickness direction of the main body (10), and extends to the corresponding target signal layer (101) in the main body (10); and a part of the wall (11) of the hole (12) is located inside the corresponding target signal layer (101), and at least a portion of the part of the wall (11) is in direct contact with the target signal layer (101).

14. The method for forming a via hole structure of claim 13, wherein the dielectric comprises resin.

* * * * *